United States Patent [19]

Milnes

[11] 4,094,704
[45] June 13, 1978

[54] DUAL ELECTRICALLY INSULATED SOLAR CELLS

[76] Inventor: Arthur G. Milnes, 1417 Inverness Ave., Pittsburgh, Pa. 15217

[21] Appl. No.: 795,811

[22] Filed: May 11, 1977

[51] Int. Cl.² .............................................. H01L 31/06
[52] U.S. Cl. ............................ 136/89 TF; 136/89 SJ; 148/174; 357/30; 357/59
[58] Field of Search ............... 136/206, 237, 238, 240, 136/89 TF, 89 SJ, 89 ST, 89 CD; 148/174, 175; 357/30, 59

[56] References Cited

U.S. PATENT DOCUMENTS

| | | | |
|---|---|---|---|
| 2,949,498 | 8/1960 | Jackson | 136/89 |
| 3,376,163 | 4/1968 | Abrahamsohn | 136/89 |
| 3,844,843 | 10/1974 | Kay et al. | 136/206 |
| 3,935,031 | 1/1976 | Adler | 136/206 |
| 4,053,326 | 10/1977 | Forrht | 136/89 |
| 4,058,418 | 11/1977 | Lindmayer | 148/175 |
| 4,064,522 | 12/1977 | Shaw et al. | 357/16 |

OTHER PUBLICATIONS

A. G. Milnes, et al., "Rheotaxy for Large Grain Thin Film Solar Cell Fabrication", Conf. Record, 12th *IEEE Photovoltaic Specialist's Conference*, Nov. 15-18, 1976, pp. 997-999.
P. Vohl, et al., "GaAs Thin-Film Solar Cells", *IEEE Trans. Electron Devices*, vol. Ed.-14, pp. 26-30, (1967).
H. J. Hovel, et al., "Minority Carrier Confinement Thin Film Solar Cell", *IBM Tech. Disc. Bull.*, vol. 18, pp. 544-545, (1975).
J. J. Cusomo, et al., "Fabrication of Large Grain Columnar Polycrystalline Thin Films", *IBM Tech. Disc. Bull.*, vol. 18, pp. 3063-3064, (1976).

*Primary Examiner*—Aaron Weisstuch
*Attorney, Agent, or Firm*—Buell, Blenko & Ziesenheim

[57] ABSTRACT

Composite solar cells of improved efficiency comprise two cells of different characteristics arranged in optical series but electrically insulated from each other. Preferably, each cell is of larger crystal grain size than its substrate, which grain size is achieved by growing the cell semi-conductor on a molten intermediate rheotaxy layer of a suitable semi-conductor which solidifies at a temperature below the melting temperature of the solar cell semi-conductor. The substrate and the intermediate rheotaxy layer of the overlying cell are transparent to that fraction of sunlight which is utilized by the underlying cell. Various configurations of overlying and underlying cells are disclosed.

13 Claims, 6 Drawing Figures

DUAL ELECTRICALLY INSULATED SOLAR CELLS

This invention relates to solar cells for use in optical series, and for such combinations of cells. It is more particularly concerned with such solar cells using rheotaxy layers to achieve large crystal grain size. A related invention disclosing methods of providing large crystal grain size films of III-V compound semi-conductors is disclosed in my co-pending application Ser. No. 741,012, filed Nov. 11, 1976.

If generation of electricity from photovoltaic cells is to become economic the cost per watt must be brought down to a very low figure, perhaps 50 cents. Furthermore, the energy expended in the manufacture of the solar cell arrays must be relatively small so that the energy payback time is short. A review of present methods of fabricating solar cells is contained in the patent application above mentioned which is incorporated by reference herein and made a part hereof.

For many years it has been recognized that for a single solar cell the use of a bandgap in the range 1.2 to 1.7 eV provides efficient solar cell performance (Wysocki and Rappaport J. Appl. Phys, 31 p 571, 1960). Bandgaps in this range provide a reasonable compromise between high output voltage and good current collection and also are less temperature dependent than solar cells of smaller bandgap material. This is the rationale for the use of semiconductors such as GaAs (bandgap 1.45 eV). Recently it has been shown that single crystal GaAs cells with $Ga_xAl_{1-x}As$ heteroface windows are capable of 18% air-mass-zero efficieny and 20% or more at air-mass-unity or AM 1.5. (Proceedings of the 11th and 12th IEEE Photovoltaic Specialists Conference).

However it has also long been recognized that large bandgap semi-conductors fail to use low energy solar photons. For instance Wolf (Proc. IRE 48 p 1246, 1960) has shown that a semi-conductor of energy gap 1.45 eV can absorb only $1.8 \times 10^{17}$ photons per second from a ground level spectrum whereas a semi-conductor of energy gap 1.07 eV can absorb $2.8 \times 10^{17}$ photons per second. Therefore, a semi-conductor such as GaAs has in theory a current collection that is only 64% of that of a silicon solar cell. Typical current collections of GaAs and Si cells at their maximum power points are 20 and 30 mA per $cm^2$, in approximate agreement with theory for air mass unity conditions.

It has been recognized that the use of two solar cells in optical series, one of high bandgap and one of low bandgap, would be advantageous in converting more of the solar energy into electrical energy and therefore giving higher efficiency. However, it was also recognized that there were difficulties in such a proposal, notably:

(a) that the fabrication of two single crystal cells that are separate increases the cost, perhaps unreasonably for the benefit obtained.

(b) that the two cells are not efficient if they are connected in series electrically as well as optically since the composite cell then tends to assume the current level that is the lower of the two cells.

(c) that attempts to equalize the current levels of the two cells, by adjustment of the bandgaps of the two cells, tend to be unsuccessful because efficiency is lost relative to simple cells and the balance is impossible to maintain over a range of solar spectrums (which vary with time of day and condition of the atmosphere) and over a range of temperature.

Yet the need for photovoltaic cells to achieve high output power at low cost is substantial. For instance, thermal solar power stations have been designed with mirror concentrator systems that have been calculated to be 26%, or more, in overall efficiency when used with steam turbines that are about 35% in efficiency. Furthermore, such thermal systems are easily arranged to provide energy storage. However, thermal solar power stations and indeed any concentration system (whether thermal or photovoltaic or both) cannot effectively use diffuse illumination, and furthermore, they use moving parts thay may be a cause of maintenance expense.

Another reason for seeking high efficiency from solar cells is that the mounting and structural costs of a solar cell array may be a significant fraction of the total system cost. Highly efficient cells are smaller in area per watt and so incur less add-on costs for the mounting structure. Also the roof area of houses may be too small to allow a large area of low-efficient cells.

The potential efficiency improvement to be gained by the use of two cells in optical series is considerable. For instance, J. Loferski at the 12th IEEE Photovoltaic Specialists Conference, Baton Rouge, November, 1976 estimated 30% efficiency for a pair of cells of bandgap 2eV and 1.1 eV.

It is an object of my invention to provide a solar cell adapted to be used in optical series with a second solar cell, the two being adjusted to share sunlight. It is another object to provide pairs of such solar cells that are in optical series but are electrically insulated from each other. More specifically, it is another object of my invention to provide such solar cells having their optically active surface films grown on optically transparent or partially transparent intermediate rheotaxy layers so as to permit the surface films to have large crystal grain size. It is yet another object of my invention to provide methods of manufacturing such cells. Other objects of my invention will become apparent in the course of the description thereof which follows.

My invention makes use of low cost transparent substrates, or films, such as quartz, glass, aluminum oxide and tin oxide on which the overlying solar cell (the first cell to receive the sunlight) is grown, and in which growth of large grain sizes for highly efficient operation is promoted by the use of a molten rheotaxy layer. This rheotaxy layer when solid must be transparent to light. In one form of the invention it must be transparent to almost the full range of the sun's spectrum. In another form of the invention it must be transparent to light that is not absorbed in the overlying solar cell and that could be absorbed in the underlying solar cell. It therefore must be a low melting point semi-conductor of large bandgap to be of low absorption of photons in the relevant energy range. Suitable rheotaxy materials are tabulated hereinafter. It must also be compatible with the processes for the completion of the dual solar cell.

In one form of my invention the overlying solar cell is grown with a partially transparent rheotaxy layer on its own transparent substrate. It is then placed in front of an underlying solar cell of smaller bandgap. The underlying solar cell may be a thin film structure grown with rheotaxy processes, as in application Ser. No. 741,012 and other known rheotaxy processes, on a low cost substrate. Alternatively the underlying solar cell may be a single crystal cell of a material such as Si or GaAs if made by a low cost process. Preferably the transparent substrate of the overlying solar cell is turned towards the sunlight so that hermetic sealing of the two solar cells is possible with the electrically functioning junctions inside the sandwich formed by the substrate of the overlying cell and the substrate of the underlying cell.

In another form of my invention the growth processes are sequenced so that both solar cells are grown on a single substrate and hermetic sealing is obtained by growth of passivating cover layers or by the use of a cover plate or back plate. Either the two cells may be grown on opposite sides of a transparent single substrate, or on the same side of the substrate with the overlying cell grown over the underlying cell, in which case the substrate need not be transparent.

In one form of this grown over kind the substrate may be a low cost material such as aluminum, copper and iron sheets (with or without protective oxide coatings), or ceramics based on aluminum oxide, aluminum silicate, silica, or glass-based substrates or carbon substrates, in which a thin layer of a semi-conductor or a metal alloy or a glassy oxide-based glaze is used in molten form during the growth of the underlying solar cell to promote the formation of predominantly large crystal grain size for this solar cell film by buffering it from the substrate. The large crystal grain size contributes to the efficiency of the solar cell. This solar cell is typically grown by chemical vapor deposition processes, or by vacuum evaporation. The cell may be of homojunction or heterojunction form and involves typically group III-V semi-conductors such as $Ga_xIn_{1-x}As$ or $GaAs_xSb_{1-x}$ of direct bandgap in the range 0.9 - 1.2eV. This cell is then covered by growth of an electrically insulating layer of a transparent material such $Al_2O_3$ or $SiO_2$ by chemical decomposition or sputtering; depending on the growth conditions this layer may be amorphous or polycrystalline, and acts as the film substrate for the growth of the large bandgap solar cell #1 that is the first cell to receive sunlight.

This insulating layer is then covered with a thin layer of the transparent rheotaxy material and the temperature raised to where this is molten and the large bandgap solar cell is then grown on the molten transparent rheotaxy layer to promote large grain size growth by buffering the desired cell material from the insulating layer grains. The large bandgap cell material may be grown by chemical deposition or vacuum evaporation processes. Requirements are that the rheotaxy layer when solid shall transmit a portion of the solar spectrum that can be used by the lower bandgap cell. Also, that the temperatures of growth of the large bandgap cell shall not harm the performance of the small bandgap cell.

The overlying solar cell may be of homojunction or heterojunction form and may be typically of III-V or II-VI semi-conductors such as GaAs, AlAs, $Ga_yAl_{1-y}As$, $AlAs_xP_{1-x}$, CdSe, CdTe, $Zn_xCd_{1-x}Te$ chosen to absorb in thin layers photons of the high portion of the sun's spectrum typically in the range 2.5 to 1.4 eV.

Embodiments of my invention presently preferred by me are illustrated in the attached Figures, to which reference is now made.

FIRST EMBODIMENT

Figure 1:
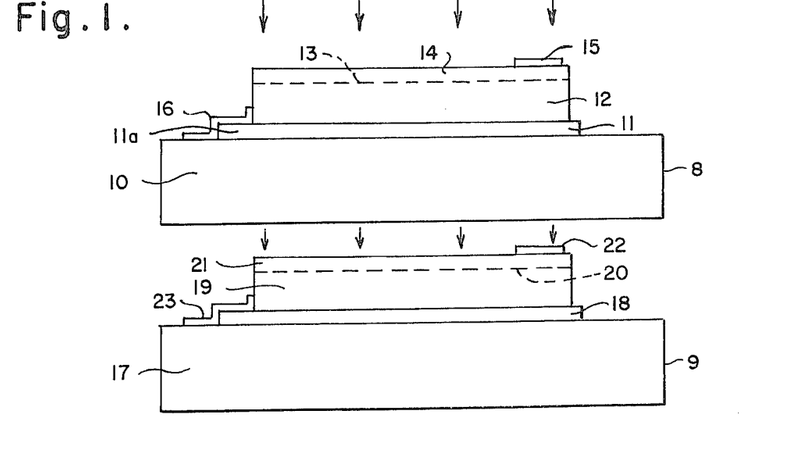
FIG. 1 is a diagrammatic representation of an overlying solar cell physically separate from an underlying solar cell.
Figure 5:
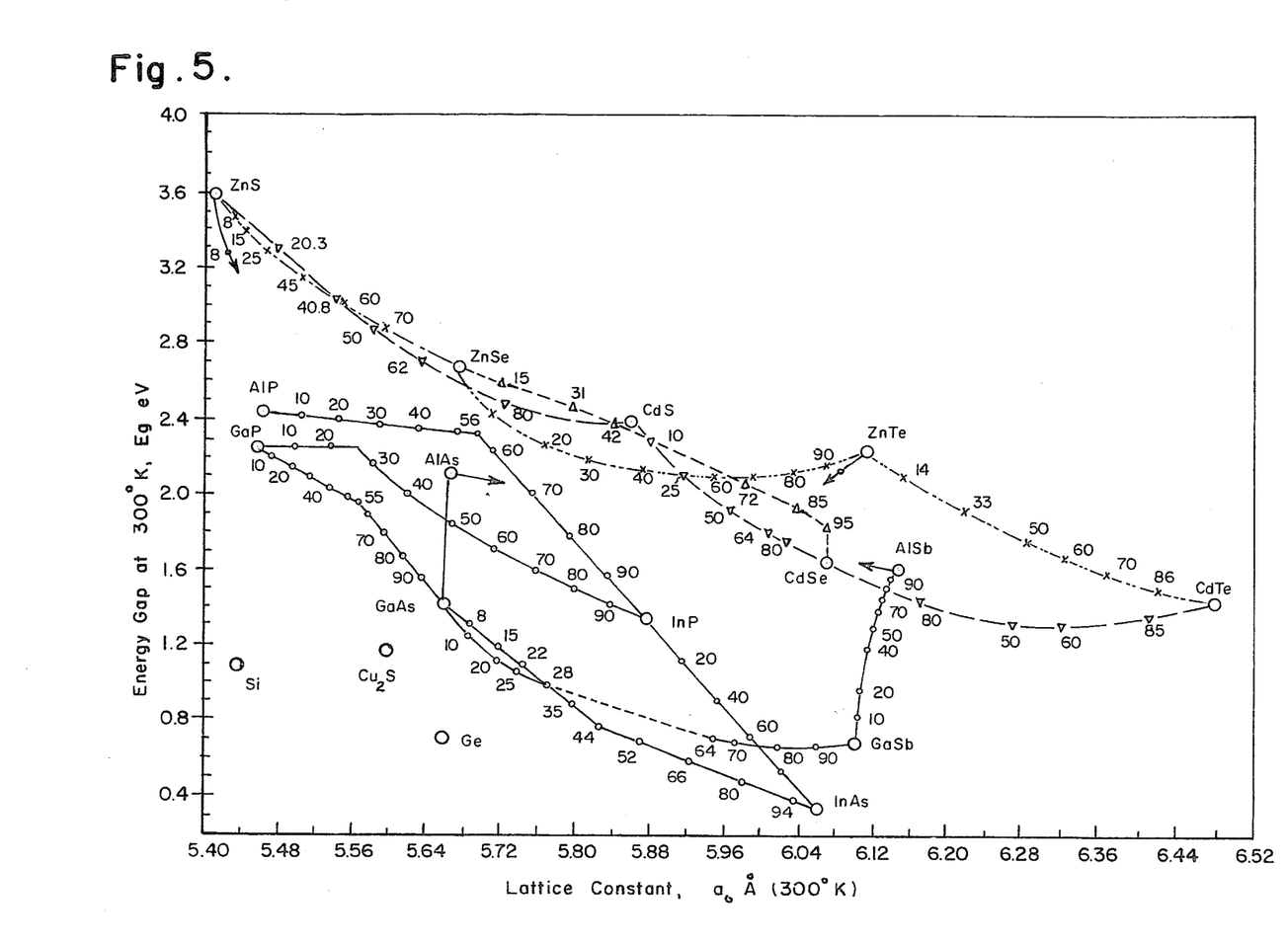
FIG. 5 is a graph of bandgaps plotted against lattice constants for various semi-conductors.

In FIG. 1, substrate 10 of the overlying solar cell is glass, which may be 0.1 cm thick and some tens of square centimeters in area. On this is grown a thin (2$\mu$m) layer 11 of Se which is $p$ type in conductivity by vacuum evaporation or other convenient means such as electroplating (Henisch, p. 95 Rectifying Semi-Conductor Contacts, Oxford 1957). On this, at a temperature of 300°-500° C, so the Se is molten, is grown a 5$\mu$m thin layer 12 of $p$ $Ga_{0.8}Al_{0.2}As$ (of bandgap 1.65 - 1.7 eV from FIG. 5) by flash evaporation with a $p$ type dopant such as Zn. This is followed by a junction 13 and a thin (1 $\mu$m) layer 14 of $nGa_{0.8}Al_{0.2}As$ by addition of Sn, Te, S or other known $n$ type dopant to the vacuum chamber atmosphere. The doping levels are preferably between $10^{17}$ and $10^{18}$ cm$^{-3}$ but may be wider in range. Although Se is an $n$ type dopant in GaAs, and related compounds, its diffusion coefficient is low and it does not form a significant $n$ layer in the $Ga_{0.8}Al_{0.2}As$ in the temperature range 300°-500° C. A section of the selenium rheotaxy layer is shadowed at 11$a$ during the growth of the GaAlAs to facilitate the making of conventional ohmic contacts 16 to the $p$ type Se which, in turn, makes ohmic contact to the $p$ layer 12. Alternatively, the top surface of the glass 10 may have been heat treated prior to growth with SnO to make it heavily electrically conducting to form the rear ohmic contact of the cell. A conventional finger-type contact 15 is made for the front face of the large bandgap overlying solar cell.

The technique of flash evaporation is summarized on page 257 of the book Milnes and Feucht, Heterojunctions and Metal Semi-conductor Junctions, Academic Press 1972 and is described in greater detail in references made on this page.

The top layer 14 may be graded in composition from $Ga_{0.8}Al_{0.2}As$ to a much higher aluminum composition, such as $Ga_{0.1}Al_{0.9}As$, in the last few hundred angstroms of growth to provide a heteroface window layer. This heteroface layer reduces carrier losses that would otherwise occur by recombination at the top surface of the $Ga_{0.8}Al_{0.2}As$ layer.

As shown in FIG. 1 the large bandgap cell 8 is used in conjunction with a smaller bandgap cell 9, that is preferably of thin film form for reasons of cost and may be np $Ga_{0.85}In_{0.15}As$. The substrate of the small bandgap cell 9 is 17, the rheotaxy layer is 18, the thin film solar cell is 19, 20 and 21, with ohmic contacts 22 and 23.

Figure 6:
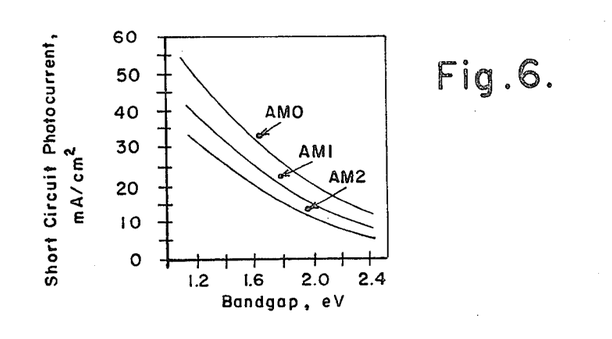
FIG. 6 is a graph of photocurrent plotted against bandgap for three different solar spectra.

From FIG. 6 it is seen that a solar cell of bandgap 1.65 eV in an air mass 1 spectrum has the potential of collecting a short circuit current of 25 mA/cm$^2$, whereas a solar cell of 1.1 eV bandgap in an air mass 1 spectrum may collect 42 mA/cm$^2$. The open circuit voltages may be about 1.15 eV and 0.55 eV, respectively. For an optical cascade of 1.65 eV and 1.1 eV cells the short circuit currents may be 25 mA/cm$^2$ and 17 mA/cm$^2$ (i.e. 42–25). Assuming then the cell fill-fractions on load to be 0.8 and 0.7 respectively, the large bandgap cell will generate 23 mW per cm$^2$ and the small bandgap cell 6.5 mW for a total power of 29.5 mW or an efficiency (neglecting reflection and contact losses) of 29.5% in an AM1 spectrum.

If the rheotaxy layer is slightly miscible with the desired semi-conductor film a variation of the growth process is possible and may be slightly advantageous. In this variation the rheotaxy layer is solid for the first few hundred angstroms of deposition of the desired solar cell semi-conductor layer. The temperature is then raised so that the rheotaxy layer becomes molten and the growth of the desired layer continued with some mixing of the rheotaxy layer and the initially grown thin layer. This technique may improve nucleation conditions for the subsequent growth of the desired layer.

Although the rheotaxy layer 11 has been described as Se it may be any of the materials listed in the Table set out hereinafter.

The growth process for either cell may be the organo-metallic processes described in a related application Ser. No. 741,012, filed Nov. 11, 1976.

In a second example of my first preferred embodiment the structure is as in FIG. 1 with substrate 10 being clear quartz; the rheotaxy layer 11 being GeS$_x$Se$_{1-x}$ deposited by vacuum evaporation; the desired solar cell layers 12, 14 being GaAs$_{0.65}$P$_{0.35}$ 1.8 eV direct gap, with a pn junction 13 grown on the molten layer 11 at a temperature of 800° C by the chemical halide deposition process of Wu (J. Electrochem Soc. 122 p. 778, 1975).

In a third example of my first preferred embodiment the structure is that of FIG. 1 where 10 is a pyrex glass substrate on which is grown as the transparent rheotaxy layer a 5μm layer of Sb$_2$Se$_3$ by evaporation. On this in the molten state at 650° – 700° C is grown by decomposition of metallo-organics a layer 12 of 10μm of p Ga$_{0.1}$Al$_{0.9}$Sb (bandgap 1.6 eV). The process involves trimethyl-gallium, trimethyl-aluminum and SbH$_3$ as described in co-pending application Ser. No. 741,012. On layer 12 is grown a thin 2μm layer of n AlAs from a usual trimethyl-aluminum and AsH$_3$ process.

In a fourth example of my first preferred embodiment, the structure is that of FIG. 1, where 10 is a clear quartz substrate on which is grown as the transparent rheotaxy layer a 5μm layer of GeS by evaporation at 200° C or by chemical vapor deposition at 500° C. On this in the molten state at 650° – 700° C is grown a 10μm layer 12 of a p GaAs by the halide decomposition process involving Ga, HCl, AsH$_3$ and H$_2$. Then on this is grown a 10μm layer 14 of n AlAs at 800° C by the halide method of Johnston and Callahan (App. Phys. Letters 28, p. 150, 1976).

SECOND EMBODIMENT

Figure 2:
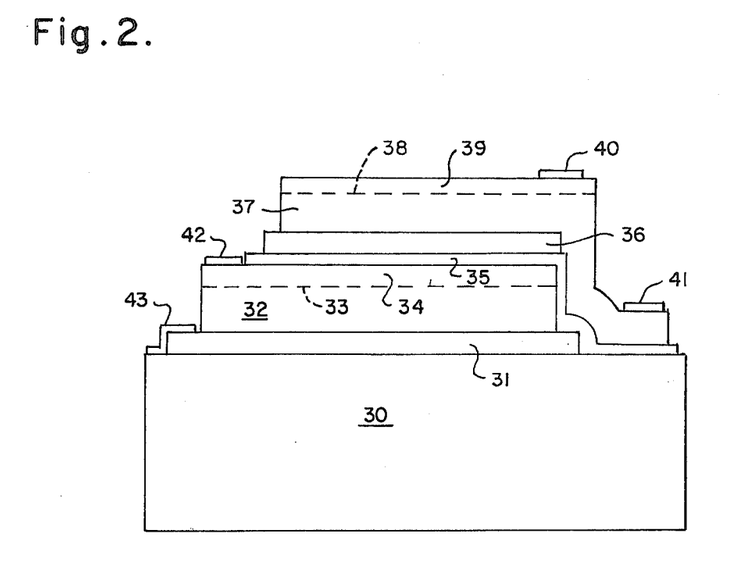
FIG. 2 is a diagrammatic representation of overlying and underlying solar cells grown one on the other on the same substrate, but electrically insulated from each other.

In FIG. 2 the substrate 30 is a slab of carbon which may be 0.5 cm thick and some tens of square centimeters of area. On this is grown a thin layer 31 of GaSb or GaSb$_x$As$_{1-x}$ or Ga$_{0.85}$In$_{0.15}$Sb by exposure to an atmosphere of Ga, In, HCl, SbH$_3$, AsH$_3$ and H$_2$ at a temperature of about 650° C following the method of Clough and Tietjen (Met. Soc. AIME 245, p. 583, 1969). Alternatively the GaSb or GaSb$_x$As$_{1-x}$ or Ga$_{0.85}$In$_{0.15}$Sb layer may be grown by other chemical vapor deposition processes or by other evaporation or sputtering processes well known to those skilled in the III-V semi-conductor epitaxy art, as described, for example, in the book by Milnes and Feucht, "Heterojunctions and Metal Semiconductor Junctions", Academic Press, 1972. The layer thickness should preferably be between 2 and 5μm to conserve material and limit the growing time, but a wide range of thickness is possible. The doping of the layer should preferably be p type which can be secured by the inclusion of a little Zn or other known p type dopant in the reaction chamber.

The atmosphere is then changed so that the AsH$_3$ is increased and the SbH$_3$ reduced to a zero or low level and indium is introduced into the growth atmosphere in the form of indium chloride and the temperature is then raised to between 720° – 800° C so that the rheotaxy layer becomes liquid. Under these conditions, As and In diffuse into the liquid intermediate layer, forming a Ga$_y$In$_{1-y}$As$_x$Sb$_{1-x}$ solution with a higher As concentration at the surface. When the As and In concentrations become large enough (determined by the phase diagram and the temperature of the intermediate film) a solid layer of Ga$_y$In$_{1-y}$As$_x$Sb$_{1-x}$ is formed. Ga$_y$In$_{1-y}$As 32 then grows on this GaAs$_x$Sb$_{1-x}$ and molten GaSb intermediate layer (the melting point of GaSb being 706° C). By adjustment of the proportions of Ga to In in the growth atmosphere the value of $y$ can be adjusted to any desired value — my preference is for the growth of Ga$_{0.85}$In$_{0.15}$As since this has an energy gap of 1.1 eV.

The Ga$_y$In$_{1-y}$As develops as a thin solid film 32 of large grain size until the desired film thickness, typically 5 – 20 μm, is achieved. The growth temperature may be raised some tens of degrees during the growth process to assist in maintaining a liquid interface at the substrate. Then the system is flushed with hydrogen and slowly cooled to room temperature. In the last micrometer or so of the growth, the layer 34 may be doped n-type by the introduction of a low concentration of H$_2$S or H$_2$Se gas into the reaction chamber. This step forms an n junction on the p GaInAs so that the desired solar cell junction 33 is formed.

Alternatively the GaSb intermediate layer and GaInAs desired film may be grown n type by the inclusion of H$_2$Se or H$_2$S in the reaction chamber. In this instance in the last micrometer, or so, of growth of the GaInAs layer the doping may be made p type by the introduction of Zn or other known p type dopant so that a p or n junction is formed.

Suitable growth rates and gas flow rates and concentrations may be found by consulting the known literature on CVD epitaxy of GaAs or GaInAs, for instance, see the papers of J. J. Tietjen and coworkers referenced in the book Heterojunctions and Metal Semi-conductor Junctions previously mentioned and the paper by Fisher et al, on the vapor growth of (InGa) As (IEEE Trans. Electron Devices, ED-21, p. 641, 1974).

The solar cell is then covered with a layer 35 of Al$_2$O$_3$ or SiO$_2$, the thickness of which is not critical, but may for example, be in the range 0.5 to 5 μm. The Al$_2$O$_3$ may be grown by the decomposition of aluminum-iso-propoxide (Aboaf, J. Electrochem Soc. 114, p. 948, 1967) in an atmosphere of argon at a temperature of 420° C. However, the temperature of decomposition may be as low as 300° C as described by Ito and Sakai (Solid State Electronics 17 p. 751, 1974). Any other known deposition process (such as sputtering) may be used provided the temperature does not harm the structure of the already deposited solar cell (typically the temperature must be less than 700° C).

If SiO$_2$ is grown as layer 35 (instead of Al$_2$O$_3$) it may be deposited from a silane oxygen mixture at a temperature of about 350° C. Alternatively, it may be deposited by decomposition of tetraethyl-silane at a temperature of about 500° C (Aboaf, loc, cit or Jordan, J. Electrochem Soc. 108, p. 478, 1961, or the general literature on this subject). The next step in the process is the deposition of the transparent rheotaxy layer 36 that is to assist the growth of the high-bandgap cell. For this rheotaxy layer the material selected (see Table) is $As_2Se_3$ of which a 2–5μm layer is deposited by vacuum evaporation with the cell at 200° C. The bandgap of $As_2Se_3$ is between 1.6 eV and 2.1 eV depending on whether it is the glassy or polycrystalline form (Abrikosov, et al., *Semiconducting II-VI, IV-VI and V-VI Compounds*, Plenum Press, 1969). The cell substrate 30 is then raised in temperature to 325° C so that the rheotaxy layer 36 is in a molten glassy form. Then a layer 37 of nCdSe (1.7 eV) is grown by vacuum evaporation of CdSe in an atmosphere of Cd and Se. This layer is about 5 μm thick. The next step is the evaporation of layer 39, that is chosen in this example to be $p$ type $Zn_xCd_{1-x}Te$ (bandgap range 1.44 – 2.26 eV) and is about 2 μm thick. This forms the pn junction 38 of the large bandgap overlying cell.

Alternatively, the $p$ type $Zn_xCd_{1-x}Te$ may be grown as layer 37 and the $n$ CdSe as layer 39.

The performance of $pZn_xCd_{1-x}Te/nCdSe$ heterojunctions is described in papers referenced in the book Milnes and Feucht, Heterojunctions and Metal Semiconductor Junctions, Academic Press 1972, and is also the subject of current study of Fahrenbruch and Bube (Proc. of IEEE 11th and 12th Photovoltaic Specialists Conferences, 1975, 1976).

The substrate is then cooled and ohmic contacts 40, 41, 42 and 43 provided by known etching and metallization procedures for semi-conductors (for instance, Milnes and Feucht, Heterojunctions and Metal Semiconductor Junctions, Academic Press, 1972). It is however desirable that the top surface of layer 34 and the bottom surface of layer 37 be made highly conducting by doping or other known methods, such as provisions of thin highly transparent and conducting metal layers or layers of transparent highly conducting semiconductors such as SnO or $Cd_2SnO_4$, or GaN.

THIRD EMBODIMENT

Figure 3:
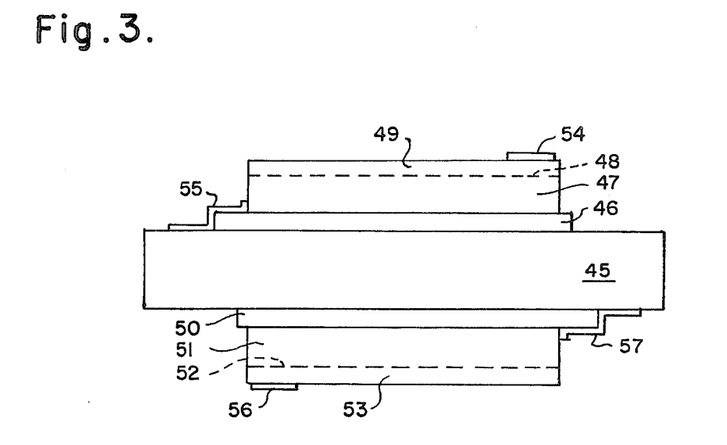
FIG. 3 is a diagrammatic representation of overlying and underlying solar cells grown on opposite sides of the same transparent substrate.

A third preferred embodiment of my invention comprises overlying and underlying solar cells grown on opposite sides of a transparent substrate, as is shown in FIG. 3. Transparent substrate 45 is provided on one surface with a transparent rheotaxy layer 46. On this layer is grown a large bandgap cell 47, 48, 49. The other surface of substrate 45 is provided with a transparent rheotaxy layer 50. On this layer is grown a small bandgap cell 51, 52, 53. Ohmic contacts 54, 55, 56 and 57 for the large bandgap junction and the small bandgap junction are provided in the manner mentioned above. The dual cell is put into service with the large bandgap cell directly exposed to sunlight. The large and small bandgap cells, the transparent rheotaxy layers and the transparent substrates can be any of those described herein.

FOURTH EMBODIMENT

Figure 4:
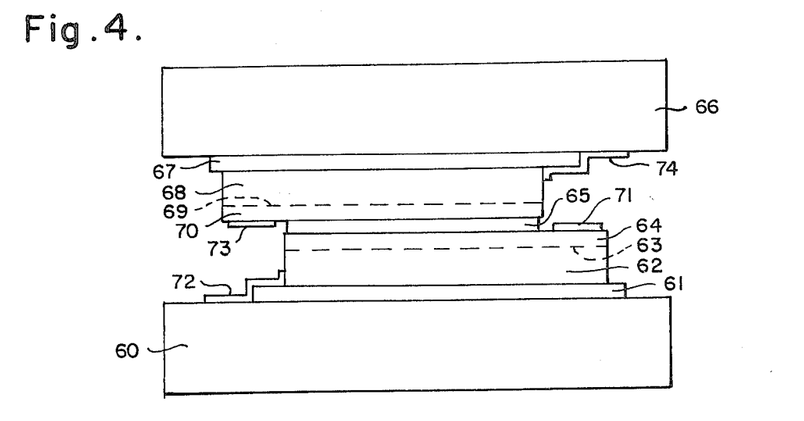
FIG. 4 is a diagrammatic representation of overlying and underlying solar cells having their active surfaces separated by a transparent electrically insulating layer and their respective substrates outermost.

FIG. 4 illustrates a fourth preferred embodiment of my invention in which overlying and underlying solar cells are separated by a transparent insulating layer between their active surfaces with their respective substrates forming the outermost layers of the sandwich. The overlying large bandgap cell and the underlying small bandgap cell are grown separately on their respective substrates and assembled with a transparent insulating layer therebetween, which may be grown on either cell.

Substrate 60 is carbon and is provided with a rheotaxy layer 61 of InSb. Deposited thereon are $n$ and $p$ layers 62 and 64 of InP, forming a junction 63. On layer 64 is grown a transparent electrically insulating layer 65 which may be $SiO_2$. The substrate 66 of the overlying cell, which must be transparent, may be quartz, glass, aluminum oxide or tin oxide. On it is grown a transparent rheotaxy layer 67 of $As_2S_3$. The large bandgap overlying cell 68, 69, 70 of $In_{0.6}Ga_{0.4}P$ is grown on the rheotaxy layer. Ohmic contacts 71 and 72 for the underlying cell and ohmic contacts 73 and 74 for the overlying cell are provided in the usual manner. The overlying cell is positioned on the underlying cell with its outer layer 69 in contact with insulating layer 65 of the underlying cell. The dual cell is put in service with transparent substrate 66 directly exposed to sunlight.

The transparent rheotaxy layer of the overlying cell must be of a material that is liquid at the growth temperature of the large bandgap overlying solar cell and compatible with the growth process used for this solar cell. Typically these growth processes are vacuum evaporation processes, halide or organo-metallic processes involving temperatures in the range 300° to 900° C. The following table lists some compounds that are suitable rheotaxy layers for my purposes.

| Materials Suitable for Transparent Rheotaxy Layers | | | |
|---|---|---|---|
| (Listed in Order of Melting or Softening Temperature) | | | |
| Transparent Rheotaxy Layer | Melting Temperature | Bandgap or Absorption Edge | Remarks |
| Se | 220° C | 1.74 eV | Amorphous or crystalline forms |
| $As_2Se_3$ | 275–375 | 2.1 | 1.6 eV in glassy form. Ge, Ag or other metal may be added to decrease the resistance, (see Edmond, J. Non-Cryst. Solids 1, p. 39, (1968)) |
| $As_2S_3$ | 310–534 | 2.1–2.5 | 1.6 eV in glassy form. Ge, Ag or other metal may be added |
| $Sb_2S_3$ | 550 | 1.6 | Evaporated films high in resistance |
| $Sb_2Se_3$ | 605 | 1.2 | 1.6 eV in amorphous form |
| GeS | 615 | 1.8 | Usually high in resistance, Se may be added |
| GeSTe | 615 | 1.72 | Also glasses of Ge-S-Te-Se may be used |
| GeSe | 650–700 | 1.16 indirect 1.5 direct | Usually p type ($GeS_2$ is 2.3 eV) |
| $SnSe_2$ | 650–675 | 1.0 indirect | Usually n type |

-continued

| Materials Suitable for Transparent Rheotaxy Layers | | | |
|---|---|---|---|
| (Listed in Order of Melting or Softening Temperature) | | | |
| Transparent Rheotaxy Layer | Melting Temperature | Bandgap or Absorption Edge | Remarks |
| In$_2$S | 653 | 2.0 | |

A few percent of metal additives such as Ag are known to decrease the resistivity of most of the materials in this table and may be used when the solar cell electrical contacts are improved by having low resistivity rheotaxy layers.

The conductivity of micro-crystalline selenium films has been described by Gobrecht and Townsend in "Recent Advances in Selenium Physics", Pergamon Press, 1965. Typically chlorine added to the amount of $10^3$ ppm raises the conductivity ($p$ type) to above $10^{-3}$ mho-cm$^{-1}$.

In general, the overlying cell in all embodiments of my invention is the larger bandgap cell. That cell is grown on a transparent rheotaxy layer to give a large grain size on a transparent substrate. The transparent rheotaxy layer must have a bandgap at least as large as that of the smaller bandgap solar cell and preferably as large as the bandgap of the larger bandgap solar cell. However, if the rheotaxy layer is an indirect bandgap semi-conductor and is only a few micrometers in thickness it is permissible for it to have a bandgap that is less than that of the large bandgap solar cell that is grown on it, since there is small light absorption in an indirect bandgap semi-conductor of small thickness.

The cell of smaller bandgap receives light that is not absorbed in the first cell. This smaller bandgap cell may be a low-cost single crystal cell or a thin-film cell grown by rheotaxy on a low cost substrate. In the first, second & fourth preferred embodiments of my invention this substrate may be carbon, metal or ceramic. Those low cost materials are relatively opaque to the transmission of light. The metal may be aluminum, iron, copper or any other low cost metal capable of withstanding the subsequent growth atmospheres and temperatures. For further protection it may be coated with an oxide to passivate the substrate surface and make it non-reactive. Suitable ceramic substrates include alumina, silica, aluminum silicate (one tradename being Mullite) and magnesium aluminum silicate (one tradename being Cordierite). A glass substrate may be used, although in these embodiments no advantage is taken of the transparency of the substrate.

On the rheotaxy layer is grown a pn semi-conductor junction. This may be either a homojunction or a heterojunction and typically the bandgap of one or other side of the junction is chosen so that is absorbs photons of energy typically greater than 1.1 eV and creates electrical energy from such absorption. This junction is provided with ohmic contacts to extract electrical power. Such contacts may be evaporated high-temperature-metal finger structures, or highly conducting transparent layers of tin oxide, or CdSnO$_4$ or GaN or other materials known to be used as transparent contacts.

The preferred semi-conductor is a direct gap semi-conductor so that the layer may be thin (20 $\mu$m or less). In the second preferred embodiment of my invention the underlying photovoltaic cell is covered by a thin electrically insulating layer that is transparent to light that has moved through the overlying solar cell and that is capable of being absorbed in the underlying solar cell. This is the minimum transparency that is acceptable, but there is no disadvantage if the transparency is greater in spectral bandwidth. The material of such an insulating layer may be Al$_2$O$_3$, SiO$_2$, Ga$_2$O$_3$, Si$_3$N$_4$ or other materials commonly known as glasses.

An evaporated high temperature metal finger contact may be provided on top of this electrically insulating layer to facilitate electrical contact to the overlying rheotaxy layer. The rheotaxy layer of the overlying cell is chosen to be transparent, when solid, to light that is not absorbed in the large bandgap overlying solar cell and that could be absorbed in the underlying small bandgap solar cell.

The large bandgap photovoltaic semi-conductor cell (either homojunction or heterojunction in form) has components with bandgaps of about 1.45 eV or greater. This overlying solar cell has electrical contacts that are quite separate from those of the underlying solar cell. This allows two separate circuits for the extraction of electrical energy from the composite solar cell.

The large bandgap solar cell may be made of semi-conductors such as GaAs, AlAs, AlAs$_x$P$_{1-x}$, AlAs$_x$N$_{1-x}$, CdSe, Zn$_x$Cd$_{1-x}$Te or SnO. This cell will be polycrystalline and for good performance it is desirable that it be of grain size that is large (10 - 200 $\mu$m) compared with the thickness of the layer (5 - 20 $\mu$m). It is desirable that at least one of the semi-conductors of the underlying photovoltaic cell be of direct bandgap in nature so that it need not be thick to absorb photons. Thin structures require less growth time and less material and therefore are usually lower in cost.

In the foregoing specification I have set out certain preferred practices and advantages of my invention, however, it will be understood that my invention can be otherwise embodied within the scope of the following claims.

I claim:
1. A solar cell, adapted for superposition upon an underlying solar cell, comprising a substrate transparent to a first range of sunlight, an intermediate solid rheotaxy layer of a semi-conductor compound transparent to a second range of sunlight overlying said substrate, the first range being at least as great as the second range, the intermediate layer being selected from the group consisting of: Se, As$_2$Se$_3$, As$_2$S$_3$, Sb$_2$S$_3$, Sb$_2$Se$_3$, GeS, GeSTe, GeSe, SnSe$_2$ and In$_2$S and intercompounds of those constituents, and a solar cell layer overlying said rheotaxy layer and comprising a polycrystalline semi-conductor compound having a larger crystal grain size than the substrate.

2. The solar cell of claim 1 in which the solar cell semi-conductor compound layer is a direct gap semi-conductor.

3. The solar cell of claim 1 in which the solar cell layer semi-conductor compound is a III-V or II-VI binary or ternary semi-conductor compound.

4. The solar cell of claim 1 in which the substrate is selected from the group consisting of quartz, glass, aluminum oxide, tin oxide and silicon oxide.

5. The solar cell of claim 1 in which the thickness of the intermediate solid rheotaxy layer is less than the thickness of the solar cell layer.

6. The solar cell of claim 1 in which the intermediate solid rheotaxy layer is a semi-conductor layer having a bandgap about as large as the bandgap of the solar cell layer.

7. The solar cell of claim 1 in which the crystal grain size of the solar cell layer is greater than the thickness of that layer.

8. The solar cell of claim 1 in combination with an underlying solar cell electrically insulated therefrom, the bandgap of the overlying solar cell being greater than the bandgap of the underlying solar cell.

9. The combination of claim 8 in which the substrate of the overlying solar cell adjoins an electrically insulating layer on the solar cell layer of the underlying solar cell.

10. The combination of claim 8 in which the two solar cells form a sandwich with their substrates outermost.

11. The combination of claim 8 in which the solar cells share the same transparent substrate but are disposed on opposite sides thereof.

12. The combination of claim 8 in which the intermediate solid semi-conductor rheotaxy layer of the overlying cell has a bandgap at least as large as the bandgap of the underlying solar cell.

13. The combination of claim 8 in which the intermediate solid semi-conductor rheotaxy layer of the overlying cell is transparent to light that is not absorbed in the overlying solar cell layer.

* * * * *

UNITED STATES PATENT OFFICE
CERTIFICATE OF CORRECTION

Patent No. 4,094,704              Dated June 13, 1978

Inventor(s) Arthur G. Milnes

It is certified that error appears in the above-identified patent and that said Letters Patent are hereby corrected as shown below:

On the title page under "U.S. PATENT DOCUMENTS", "Forrht" should be --Forrat--.

On the title page under "OTHER PUBLICATIONS", "J.J. Cusomo" should be --J.J. Cuomo--.

Column 2, line 14, "thay" should be --that--.

Column 8, in the Table under "Remarks", the next to last Remark "Usually p type ($GeS_2$ is 2.3 eV)" should read --Usually p type ($GeSe_2$ is 2.3 eV)--.

Signed and Sealed this

Twenty-first Day of November 1978

[SEAL]

Attest:

RUTH C. MASON
Attesting Officer

DONALD W. BANNER
Commissioner of Patents and Trademarks